United States Patent
Remaklus, Jr. et al.

(10) Patent No.: US 7,088,633 B2
(45) Date of Patent: Aug. 8, 2006

(54) METHOD AND SYSTEM FOR PROVIDING SEAMLESS SELF-REFRESH FOR DIRECTED BANK REFRESH IN VOLATILE MEMORIES

(75) Inventors: Perry Willmann Remaklus, Jr., Raleigh, NC (US); Robert Michael Walker, Raleigh, NC (US)

(73) Assignee: QUALCOMM Incorporated, San Diego, CA (US)

( * ) Notice: Subject to any disclaimer, the term of this patent is extended or adjusted under 35 U.S.C. 154(b) by 130 days.

(21) Appl. No.: 10/982,277

(22) Filed: Nov. 5, 2004

(65) Prior Publication Data
US 2005/0265103 A1 Dec. 1, 2005

Related U.S. Application Data

(60) Provisional application No. 60/575,335, filed on May 27, 2004.

(51) Int. Cl.
*G11C 7/00* (2006.01)
(52) U.S. Cl. .................................. 365/222; 365/230.08
(58) Field of Classification Search ................ 365/149, 365/189.05, 222 O, 230.03, 230.08 X
See application file for complete search history.

(56) References Cited

U.S. PATENT DOCUMENTS

| 4,687,107 | A | * | 8/1987 | Brown et al. ................ 209/556 |
| 5,999,472 | A | * | 12/1999 | Sakurai ....................... 365/222 |
| 6,310,814 | B1 | | 10/2001 | Hampel et al. |
| 2002/0023193 | A1 | * | 2/2002 | Nakamura .................... 711/106 |
| 2003/0218930 | A1 | | 11/2003 | Lehmann et al. |

* cited by examiner

*Primary Examiner*—VanThu Nguyen
(74) *Attorney, Agent, or Firm*—Philip R. Wadsworth; Charles D. Brown; Nicholas J. Pauley (57) ABSTRACT

A memory system is provided. The system includes a volatile memory having a number of banks and configured to engage in one of a number of operating modes including an auto-refresh mode and a self-refresh mode, and a memory controller configured to direct the volatile memory to engage in one of the operating modes. Upon the memory controller directing the volatile memory to engage in the self-refresh mode, the memory controller is further configured to provide an entry bank address to the volatile memory, the entry bank address corresponding to the first bank that is to be refreshed during the self-refresh mode. Upon the volatile memory exiting the self-refresh mode, the volatile memory is further configured to make an exit bank address available to the memory controller, the exit bank address corresponding to the last bank that was refreshed prior to the volatile memory exiting the self-refresh mode.

29 Claims, 6 Drawing Sheets

METHOD AND SYSTEM FOR PROVIDING SEAMLESS SELF-REFRESH FOR DIRECTED BANK REFRESH IN VOLATILE MEMORIES

RELATED APPLICATIONS

This application claims priority to U.S. Provisional Application Ser. No. 60/575,335 filed May 27, 2004.

BACKGROUND

1. Field

The present disclosure relates generally to memory devices, and more specifically, to methods and systems for providing seamless self-refresh for directed bank refresh in volatile memories.

2. Background

Volatile memory is a storage medium that is generally structured as a number of arrays (or banks). Each bank is further arranged as a matrix of "memory cells" in rows and columns, with each column being further divided by the input/output (I/O) width of the memory. Locations within the memory are uniquely specified by bank, row and column. A memory controller may be used to retrieve data from the memory by indicating the data's bank, row and column location. For example, for a quad-bank 128 Mb memory with a 16-bit external data bus, a possible logical address mapping includes a 9-bit column address, a 2-bit bank address and a 12-bit row address.

Prior to reading or writing a memory location, the corresponding row must first be opened. The process of opening a row requires a minimum number of clock cycles, $t_{RCD}$, which represents the row-to-column delay. Once a row is open, column addresses within that row can be read or written as desired. For some dynamic random access memories (DRAMs), such as synchronous DRAMs (SDRAMs), only one row per bank can be kept open at any one time; a subsequent memory access to be performed within the same bank but at a different row requires closing the current row and opening the new one.

In the case of dynamic volatile memories, each cell must be refreshed, or re-energized, periodically at an average interval, $t_{REFI}$, in order to maintain data integrity. The cells have to be refreshed because they are designed around capacitors that store electrical charges, which may discharge over time. Refresh is the process of recharging, or re-energizing, the cells in memory. Cells are generally refreshed one row at a time. A number of methods currently exist that are designed to refresh volatile memories. Some, if not all, of these methods incur high cost in performance and/or power. For example, there are two common methods or techniques that are generally used to control the refresh of volatile memories in modem digital systems. One method relies on the memory to keep track of the row and bank that need to be refreshed using built-in refresh mechanisms that are available on the memory; the other method relies on the memory controller to keep track of the row and bank that need to be refreshed.

The first commonly used method is utilized by the auto-refresh and self-refresh functions of the volatile memories. These functions use the built-in refresh address of the memory. During active use of the memory, if a refresh cycle is required, the memory controller precharges all the banks, and then uses the auto-refresh command to tell the memory to issue an internal refresh cycle. Upon receiving the auto-refresh command, the memory increments the internal refresh address counter and executes the internal refresh cycle. In auto-refresh mode, the memory uses the refresh address in its internal refresh address counter to determine which rows/banks to perform the refresh cycle and cycle through the relevant rows. In one implementation, the internal refresh address counter includes a row address register and a bank address register. The internal refresh address counter is controlled by a refresh clock. The bank address register is incremented to cycle through each of the memory banks with the carry-out of the bank address register causing the row address register to increment. Other implementations do not have a bank address register as all banks are simultaneously refreshed.

A disadvantage of present non-simultaneous bank auto-refresh implementations is that because the memory controller does not know which internal bank will be refreshed, the memory controller is required to close all open rows prior to issuing an auto-refresh command. As a result, the memory data bus availability during an auto-refresh sequence is zero. At best, this sequence requires $t_{RP}+t_{RFC}+t_{RCD}$ cycles, where $t_{RP}$ represents a row-precharge delay, $t_{RFC}$ represents refresh cycle time and tRCD represents the row-to-column delay. For a 133 MHz memory, this could be 16 clock cycles (120 ns). These cycles are sometimes referred to as dead cycles since the memory data bus is not available during this period.

During periods of non-use, the memory controller may place the memory in the self-refresh mode. In the self-refresh mode, the memory uses its own internal clock and refresh address counter to generate refreshes to refresh the row(s) of the memory. This method is good for saving power during idle states since the self-refresh mode can be used. The self-refresh state uses a small amount of power and maintains the contents of the memory by refreshing the memory. Due to the small amount of power needed, this method is typically used for low power applications.

A second method is sometimes used to avoid the dead cycles on the memory data bus mentioned above. According to this second method, control of the refresh is effected via the memory controller. This method does not use any of the built-in refresh mechanisms that are available on the memory. Under this method, at regularly given intervals ($t_{REFI}$), the memory controller explicitly generates refreshes by opening and closing rows in a sequential manner using bank/row address combinations. The refresh clock, which determines the refresh rate, and the bank/row address combinations are internal to the memory controller. This method is best for high speed/high performance applications. This method allows the memory controller to refresh a particular memory bank while permitting other memory banks to remain open for access, resulting in higher performance; reads and writes to other banks can generally continue in parallel and uninterrupted. The downside to this method is that during system power down or long idle states, when the memory controller is not refreshing the memory, the memory cannot be kept in a self-refresh state. As mentioned above, the self-refresh state is a built-in function of most volatile memories. Since the self-refresh function of the memory increments a refresh address (i.e., the row/bank address) stored in a refresh address counter in the memory, independent of the memory controller, the refresh address maintained by the memory is not consistent or synchronized with the memory controller.

Refresh operations can reduce performance of memory subsystems because each refresh cycle forces the memory into an idle state, during which data access is not available. For example, if a refresh cycle is required for a particular memory bank while such bank is in an active state, the bank has to be shut down to allow the refresh operation to take place. Shutting down the bank means that whatever data operations that were to be performed have to be delayed, hence, affecting system performance.

Some existing schemes are available to reduce the performance impact of refresh operations. Such schemes typically involve using a higher than required refresh rate, so that more memory banks can be refreshed within a predetermined refresh period. By having more memory banks refreshed, the chances of having to shut down an active memory bank for refresh are reduced. Using a higher refresh rate, however, has its drawbacks. For example, an increase in refresh rate means more power is needed which, in turn, results in lower performance. Also, merely using a higher refresh rate does not always obviate the need to shut down an active memory bank when refresh is required; in some situations, an active memory bank has to be shut down regardless, thus, negating any benefits from using a higher refresh rate.

Hence, it would be desirable to provide more efficient methods and systems for providing seamless self-refresh for directed bank refresh in volatile memories.

SUMMARY

In one aspect of the present invention, a memory system includes a volatile memory having a plurality of banks and configured to engage in one of a plurality of operating modes including an auto-refresh mode and a self-refresh mode, and a memory controller configured to direct the volatile memory to engage in one of the plurality of operating modes, wherein upon the memory controller directing the volatile memory to engage in the self-refresh mode, the memory controller is further configured to provide an entry bank address to the volatile memory, the entry bank address corresponding to the first bank that is to be refreshed during the self-refresh mode, and wherein upon the volatile memory exiting the self-refresh mode, the volatile memory is further configured to make an exit bank address available to the memory controller, the exit bank address corresponding to the last bank that was refreshed prior to the volatile memory exiting the self-refresh mode.

In another aspect of the present invention, a memory system includes a volatile memory having an entry bank address latch, an exit bank address latch and a plurality of banks, and a memory controller configured to direct the volatile memory to engage in one of a plurality of operating modes including an auto-refresh mode and a self-refresh mode, wherein upon the memory controller directing the volatile memory to engage in the self-refresh mode, the memory controller is further configured to load an entry bank address into the entry bank address latch, the entry bank address corresponding to the first bank that is to be refreshed during the self-refresh mode, and wherein upon the volatile memory exiting the self-refresh mode, the volatile memory is further configured to load an exit bank address into the exit bank address latch, the exit bank address corresponding to the last bank that was refreshed prior to the volatile memory exiting the self-refresh mode, and wherein the exit bank address latch is accessible to the memory controller.

In yet another aspect of the present invention, a memory system includes a volatile memory having a plurality of banks, first storage means configured to store an entry bank address and second storage means configured to store an exit bank address, and a memory controller configured to direct the volatile memory to engage in one of a plurality of operating modes including an auto-refresh mode and a self-refresh mode, wherein upon the memory controller directing the volatile memory to engage in the self-refresh mode, the memory controller is further configured to load the entry bank address into the first storage means, the entry bank address corresponding to the first bank that is to be refreshed during the self-refresh mode, and wherein upon the volatile memory exiting the self-refresh mode, the volatile memory is further configured to load the exit bank address into the second storage means, the exit bank address corresponding to the last bank that was refreshed prior to the volatile memory exiting the self-refresh mode, and wherein the second storage means is accessible to the memory controller.

In one aspect of the present invention, a memory system includes a volatile memory having a plurality of banks, an entry bank address latch, an exit bank address latch, a refresh clock and a refresh counter, the refresh counter further having a row address counter and a row increment counter, wherein the refresh clock is configured to control the refresh counter and the entry bank address latch, wherein the row increment counter is configured to increment the row address counter, and a memory controller configured to control the volatile memory to engage in an auto-refresh mode or a self-refresh mode, the memory controller further configured to load a bank address for a target bank into the entry bank address latch, wherein the memory controller is further configured to direct the volatile memory to engage in the auto-refresh mode to perform an auto-refresh operation on the target bank, wherein the row increment counter is configured to be incremented each time an auto-refresh operation is performed, wherein the row increment counter is further configured to increment the row address counter after a predetermined number of auto-refresh operations have been performed, wherein the row address counter includes a row address that is usable to identify a row in the target bank for the auto-refresh operation, wherein upon the volatile memory entering into the self-refresh mode, the volatile memory is further configured to perform one or more self-refresh operations using the bank address stored in the entry bank address latch, wherein the volatile memory is further configured to increment the entry bank address latch after each self-refresh operation, and wherein upon the volatile memory exiting the self-refresh mode, the volatile memory is configured to load the current value of the entry bank address latch into the exit bank address latch, the value in the exit bank address latch corresponding to the last bank that was refreshed prior to the volatile memory exiting the self-refresh mode.

In yet another aspect of the present invention, a memory system includes a volatile memory having an entry bank address latch, an exit bank address latch, a plurality of banks, a plurality of refresh row counters, each refresh row counter associated with a corresponding bank and configured to store a target row address, and a memory controller configured to direct the volatile memory to engage in an auto-refresh mode, the memory controller further configured to load a target bank address into the entry bank address latch, wherein the volatile memory is configured to perform an auto-refresh operation in the auto-refresh mode, the auto-refresh operation being performed on a target bank identified by the target bank address using the target row address stored in the refresh row counter associated with the target bank, wherein the memory controller is further configured to direct the volatile memory to engage in a self-refresh mode, wherein the volatile memory is further configured to cycle through the plurality of banks in the self-refresh mode by incrementing the entry bank address latch to generate the current target bank address, and wherein during each self-refresh operation, the volatile memory is further configured to refresh the bank identified by the current target bank address based on the target row address stored in the associated refresh row counter, and wherein upon the volatile memory exiting the self-refresh mode, the volatile memory is further configured to load the value stored in the entry bank address latch into the exit bank address latch, the value in the exit bank address latch corresponding to the last bank that was refreshed prior to the volatile memory exiting the self-refresh mode.

In a further aspect of the present invention, a method for controlling memory refresh for a volatile memory having a plurality of banks, includes forwarding an entry bank address to the volatile memory, directing the volatile memory to engage in a self-refresh mode to perform one or more self-refresh operations based on the entry bank address, the entry bank address corresponding to a target bank where the one or more self-refresh operations is to begin, and directing the volatile memory to make available an exit bank address upon the volatile memory exiting the self-refresh mode, the exit bank address corresponding to the last bank that was refreshed prior to the volatile memory exiting the self-refresh mode.

In yet a further aspect of the present invention, a method for controlling memory refresh for a volatile memory having an entry bank address latch, an exit bank address latch and a plurality of banks, includes loading an entry bank address into the entry bank address latch, directing the volatile memory to retrieve the entry bank address from the entry bank address latch, directing the volatile memory to engage in a self-refresh mode to perform one or more self-refresh operations based on the entry bank address, the entry bank address corresponding to a target bank where the one or more self-refresh operations is to begin, and storing an exit bank address into the exit bank address latch upon the volatile memory exiting the self-refresh mode, the exit bank address corresponding to the last bank that was refreshed prior to the volatile memory exiting the self-refresh mode.

It is understood that other embodiments of the present invention will become readily apparent to those skilled in the art from the following detailed description, wherein various embodiments of the invention are shown and described by way of illustration. As will be realized, the invention is capable of other and different embodiments and its several details are capable of modification in various other respects, all without departing from the spirit and scope of the present invention. Accordingly, the drawings and detailed description are to be regarded as illustrative in nature and not as restrictive.

BRIEF DESCRIPTION OF THE DRAWINGS

Aspects of the present invention are illustrated by way of example, and not by way of limitation, in the accompanying drawings, wherein.

DETAILED DESCRIPTION

The detailed description set forth below in connection with the appended drawings is intended as a description of various embodiments of the present invention and is not intended to represent the only embodiments in which the present invention may be practiced. The detailed description includes specific details for the purpose of providing a thorough understanding of the present invention. However, it will be apparent to those skilled in the art that the present invention may be practiced without these specific details. In some instances, well-known structures and components are shown in block diagram form in order to avoid obscuring the concepts of the present invention.

Figure 1:
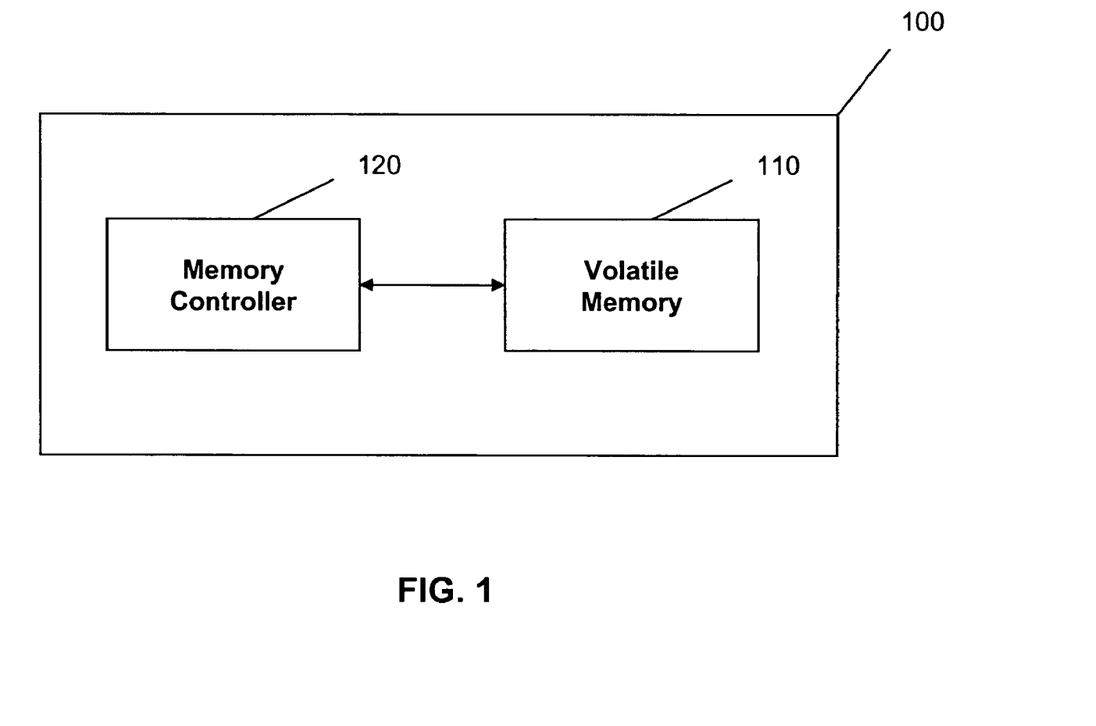
FIG. 1 is a simplified block diagram illustrating an arrangement that can be used to practice the seamless refresh method according to the present disclosure.

Various embodiments of a memory system will now be described. In one embodiment, a seamless refresh method is provided which allows a specific bank to be identified for the first self-refresh operation upon a memory entering self-refresh mode; the refresh method also allows information relating to the last refreshed bank to be conveyed to a memory controller upon the memory exiting self-refresh mode. FIG. 1 shows an arrangement 100 that can be used to practice the seamless refresh method. As shown in FIG. 1, the seamless refresh method may be practiced with a volatile memory 110 and a memory controller 120 configured to control the volatile memory 110. The volatile memory 110 can be, for example, a DRAM (dynamic random access memory), a SDRAM (synchronous DRAM), and various other types of DRAM, etc. Based on the disclosure and teachings provided herein, a person of ordinary skill in the art will appreciate how to practice the present disclosure with other types of memories which require refresh operations. In one embodiment, the seamless refresh method is effected via control logic or a processor (not shown) which controls the memory controller 120 and the volatile memory 110. It should be understood that the control logic or processor may be implemented as an independent module or integrated as part of another component, such as, the memory controller 120.

Figure 2:
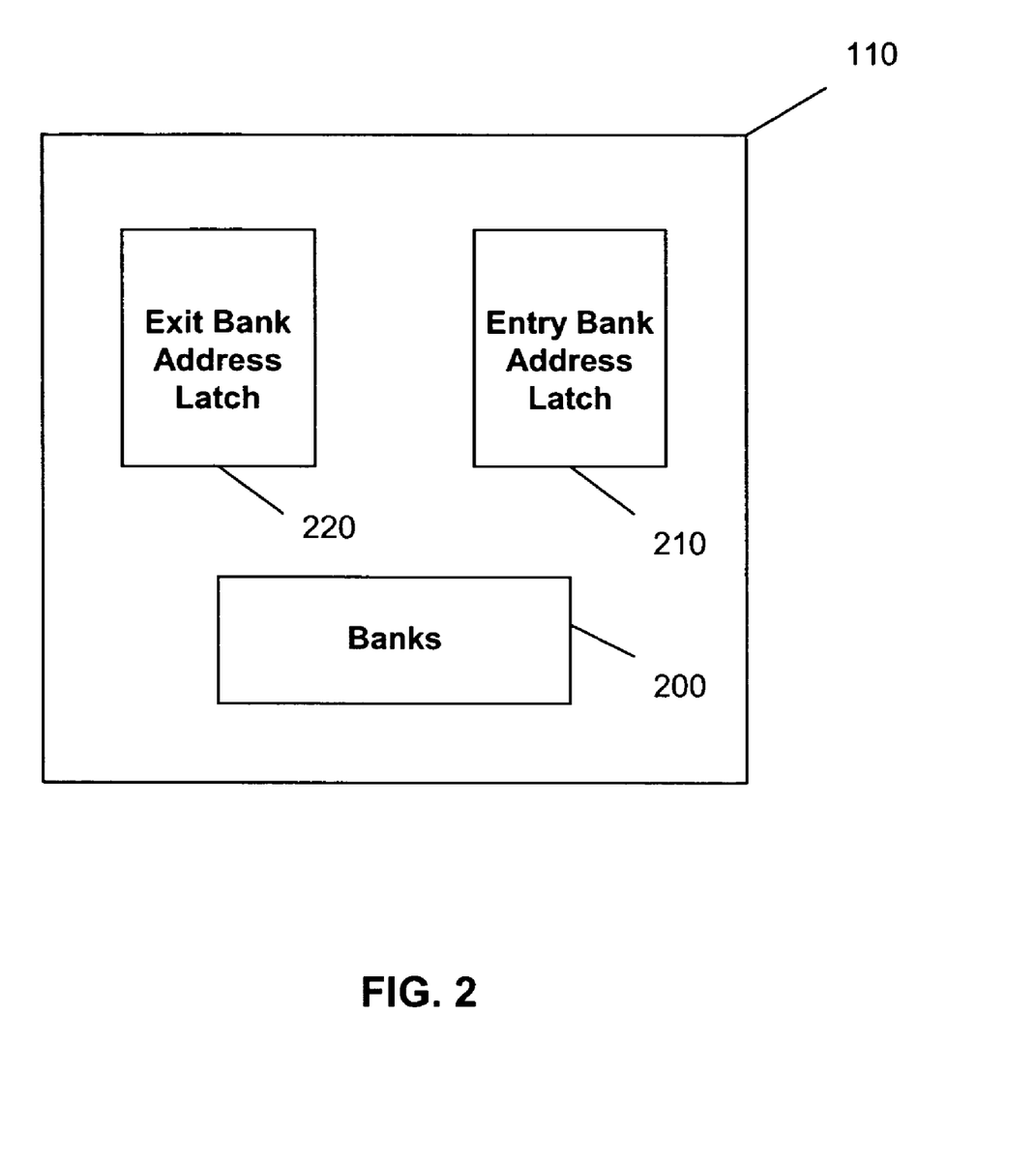
FIG. 2 is a simplified block diagram illustrating one embodiment of a volatile memory that can be used to practice the seamless refresh method according to the present disclosure.

FIG. 2 illustrates one embodiment of the volatile memory 110 that can be used to practice the seamless refresh method. The volatile memory 110 may further include a number of banks 200, an entry bank address latch 210 and an exit bank address latch 220. The seamless refresh method optimizes the transition between auto-refresh cycles and self-refresh cycles. When the memory controller 120 commands the volatile memory 110 to enter self-refresh mode, the memory controller 120 signals to the volatile memory 110 which bank to refresh next by using a target bank address. The target bank address is loaded into the entry bank address latch 210.

Figure 3:
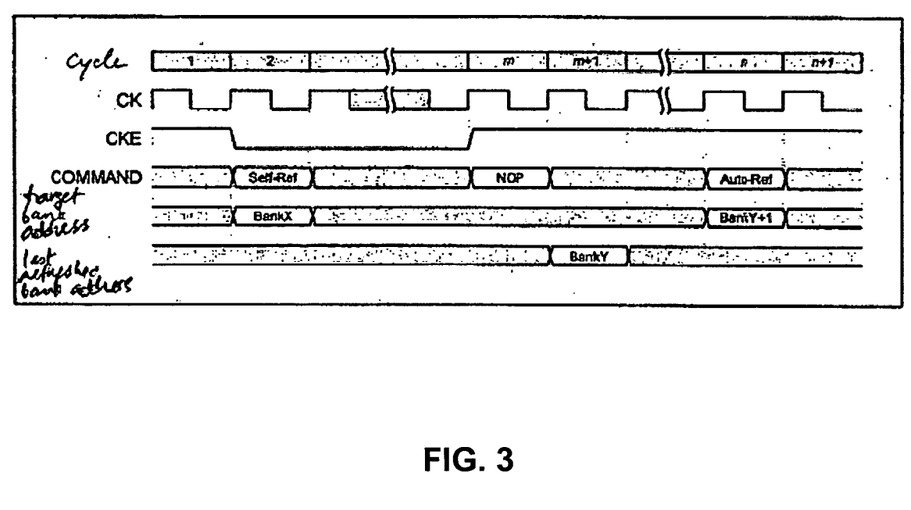
FIG. 3 is a simplified timing diagram illustrating various signals during operation of the refresh method according to the present disclosure.

FIG. 3 shows that in Cycle "2" the memory controller 120 issues the command to place the volatile memory 110 in self-refresh mode indicating that the memory's first self-refresh cycle is to be performed on a specific bank, BankX. Then, at Cycle "m+1", the volatile memory 110 exits self-refresh mode and loads the bank address of the last refreshed bank, BankY, into the exit bank address latch 220. The memory controller 120 retrieves the content of the exit bank address latch 220 and then uses it to identify the last bank that the volatile memory 110 refreshed prior to exiting self-refresh mode. Since the memory controller 120 does not know when this last bank was refreshed, the memory controller 120 directs the volatile memory 110 to perform an auto-refresh operation on the next bank, BankY+1, that is due for refresh as soon as practicable.

Figure 6:
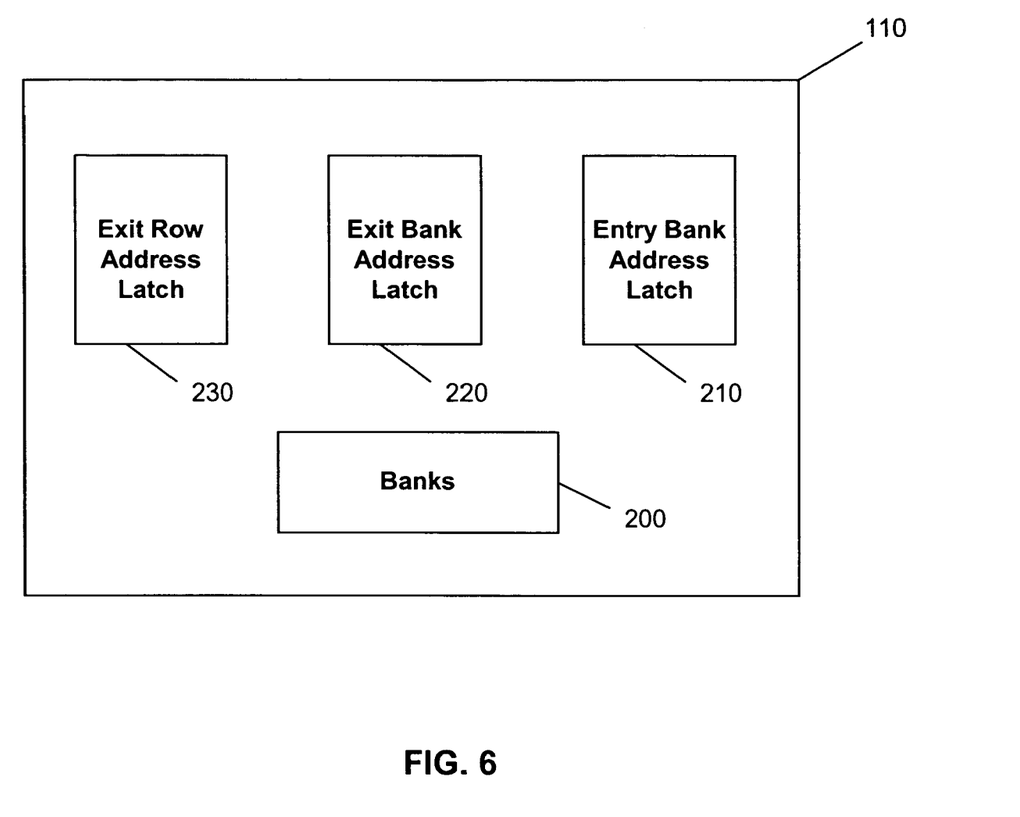
FIG. 6 is a simplified block diagram illustrating another embodiment of a volatile memory that can be used to practice the seamless refresh method according to the present disclosure.

In another embodiment as shown in FIG. 6, the volatile memory 110 may further include an exit row address latch 230. Prior to exiting the self-refresh mode, the row address of the last refreshed row may be loaded into the exit row address latch 230. The contents of the exit row address latch 230 are accessible to the memory controller 120 (see FIG. 1). Hence, after the volatile memory 110 exits the self-refresh mode, information relating to the bank address and the row address of the last refreshed row and bank is available to the memory controller 120 from the exit row address latch 230 and the exit bank address latch 220. The memory controller 120 can then utilize this information for future operations accordingly.

Based on the disclosure and teachings provided herein, a person of ordinary skill in the art will appreciate how to apply the seamless refresh method disclosed herein to different volatile memory arrangements in accordance with the concepts disclosed in the present disclosure. For example, the seamless refresh method can be used in connection with two approaches which have been proposed that allow a memory controller to direct refreshes to a specific bank in a memory in auto-refresh mode.

Figure 4:
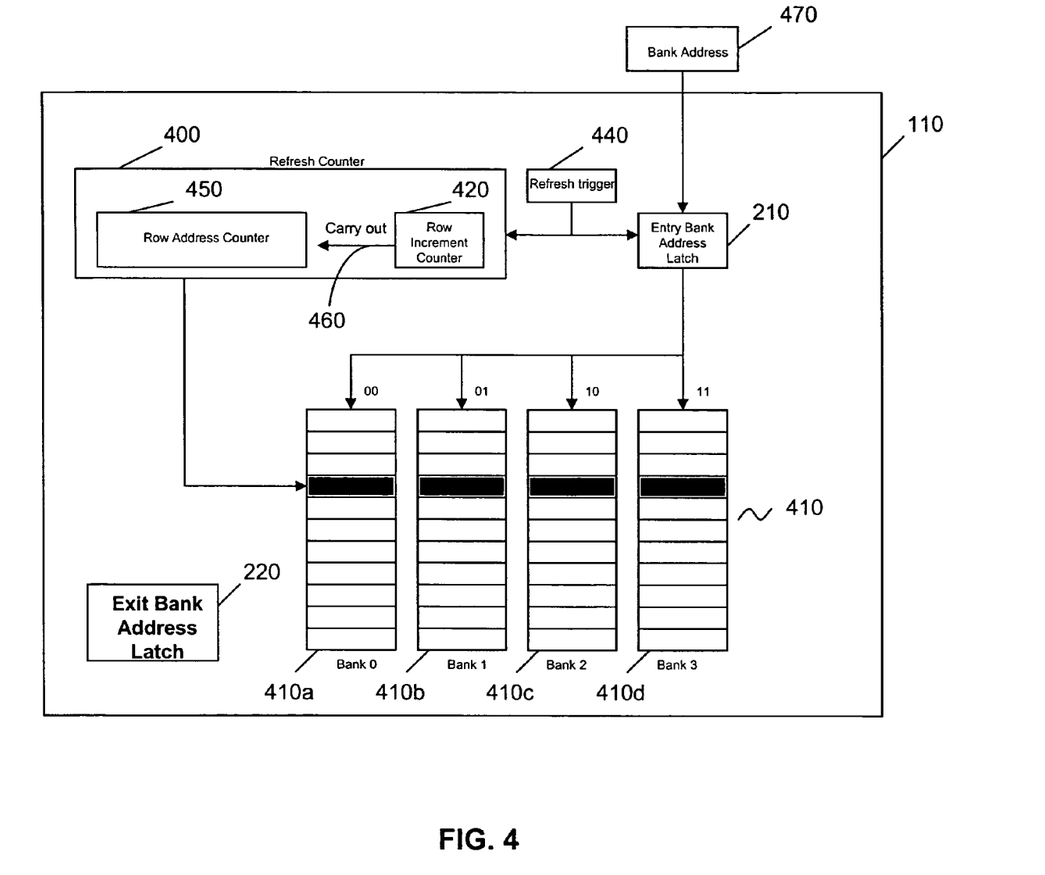
FIG. 4 is a simplified block diagram illustrating another embodiment of a volatile memory that can be used to practice the seamless refresh method according to the present disclosure.

In the first approach, a memory controller is able to provide a target bank address for a specific bank to a volatile memory for auto-refresh operation in auto-refresh mode. FIG. 4 shows one embodiment of the volatile memory 110 that can be used to practice a directed refresh method under the first approach. The volatile memory 110 may further include a refresh counter 400 having a row address counter 450 and a row increment counter 420, a refresh trigger 440, the entry bank address latch 210 and a number of banks 410.

The refresh trigger 440 may be used to control both the refresh counter 400 and the entry bank address latch 210. The refresh trigger 440 is used by the volatile memory 110 to initiate a refresh operation either in the auto-refresh mode or self-refresh mode. For example, upon receiving an auto-refresh command from the memory controller 120 (see FIG. 1), the volatile memory 110 may direct the refresh trigger 440 to initiate the auto-refresh operation. The refresh trigger 440 can be, for example, a clock or other timing mechanisms.

The row address counter 450 may be used to store the target row address for the row that is to be refreshed. The entry bank address latch 210 may be used to store the target bank address for the specific bank containing the row that is to be refreshed.

The memory controller 120 may direct the volatile memory 110 to auto-refresh a specific memory bank within the volatile memory 110 while other memory banks remain available for access. For each auto-refresh cycle initiated by the memory controller 120, the bank address 470 may be loaded by the memory controller 120 (see FIG. 1) into the entry bank address latch 210. The bank address 470 is used to select one of the banks 410 for refresh. Because the memory controller 120 (see FIG. 1) is aware of the specific bank to be refreshed, access to the other internal banks may continue without interruption. This tends to maximize the memory data bus utilization, reduces power consumption by avoiding unnecessary row close/open sequences, and serves to minimize transfer latency.

The row increment counter 420 may be initialized upon power-up or reset. The initialized value for the row increment counter 420 can be arbitrary. The row increment counter 420 causes the row address counter 450 to be incremented after a predetermined number of auto-refresh operations have been performed. The row address counter 450 contains the target row address for a row that is to be refreshed. The row address counter 450 points to the same row in all the banks 410.

The memory controller 120 initiates each auto-refresh cycle by issuing an auto-refresh command to the volatile memory 110 and loading the bank address 470 for the bank to be refreshed into the entry bank address latch 210. Upon receiving the auto-refresh command, the volatile memory 110 uses the refresh trigger 440 to initiate each auto-refresh operation. The refresh trigger 440 causes the row increment counter 420 to increment. Cyclically, the row address counter 450 is incremented by a carry-out signal 460 from the row increment counter 420. For example, the row increment counter 420 may be a 2-bit counter, which means the row increment counter 420 repeats itself every four (4) refresh clock cycles; conversely, the row address counter 450 is incremented after every 4th auto-refresh operation. The target row address stored in the row address counter 450 and the bank address stored in the entry bank address latch 210 are then used to refresh a specific row in the identified bank.

Since the target row address changes periodically based on the predetermined number of auto-refresh operations and the memory controller 120 does not know when the row address counter 450 will be incremented, the memory controller 120 (see FIG. 1) issues auto-refresh commands in a consistent, sequential order with respect to the banks 410; in other words, the memory controller 120 loads the bank addresses of the banks 410 into the entry bank address latch 210 one at a time in a sequential manner during each auto-refresh cycle. As a result, the banks 410 are refreshed sequentially in successive auto-refresh cycles. For example, for the four (4) banks shown in FIG. 4, the refresh bank order could be either "3-2-1-0-3-2-1-0" or "-1-2-3-0-1-2-3". One order does not have an advantage over the other. Therefore, either one can be used. In one implementation, the sequence "0-1-2-3-0-1-2-3- . . . " may be used. As will be further described below, choosing this sequence simplifies the transition into self-refresh mode.

The operation of the volatile memory 110 as shown in FIG. 4 is further illustrated in an example as follows. In this example, the initial value in the row increment counter 420 is assumed to be zero (0) and the carry-out signal 460 of the row increment counter 420 is activated after every 4th auto-refresh operation. The memory controller 120 (see FIG. 1) issues an auto-refresh command to the volatile memory 110 and loads the bank address 470 for the bank 410a into the entry bank address latch 210 to initiate a first auto-refresh cycle. Upon receiving the auto-refresh command, the volatile memory 110 directs the refresh trigger 440 to initiate an auto-refresh operation. During the auto-refresh operation, the row increment counter 420 is incremented to a value of one (1). In this instance, the carry-out signal 460 is not activated and the row address counter 450 is not incremented. The target row address and the bank address currently stored in the row address counter 450 and the entry bank address latch 210 respectively are then used to refresh a specific row in the bank 410*a*.

Subsequently, the memory controller 120 (see FIG. 1) issues another auto-refresh command to the volatile memory 110 and loads the bank address 470 for the bank 410*b* into the entry bank address latch 210 to initiate a second auto-refresh cycle. Similarly, upon receiving the second auto-refresh command, the volatile memory 110 directs the refresh trigger 440 to initiate another auto-refresh operation. During this auto-refresh operation, the row increment counter 420 is incremented to a value of two (2). Again, the carry-out signal 460 is not activated and the row address counter 450 is not incremented. The target row address and the bank address currently stored in the row address counter 450 and the entry bank address latch 210 respectively are then used to refresh a specific row in the bank 410*b*. It should be noted that since the row address counter 450 is not incremented, the target row address used in this auto-refresh operation is the same as the one used in the last auto-refresh operation. However, for this auto-refresh operation, the bank address stored in the entry bank address latch 210 is different in that a different bank 410*b* is identified. As a result, the same row in a different bank 410*b* (as opposed to bank 410*a*) is refreshed.

Similarly, it will be appreciated that for the 3d and 4th auto-refresh cycles, the row address counter 450 is not incremented (since the carry-out signal 460 of the row increment counter 420 is not activated). Consequently, the same row in different banks 410*c* and 410*d* are refreshed during the 3rd and 4th auto-refresh cycles.

For the 5th auto-refresh cycle, the bank address 470 loaded by the memory controller 120 (see FIG. 1) into the entry bank address latch 210 points back to the bank 410*a*. Furthermore, the carry-out signal 460 of the row increment counter 420 is now activated since four (4) auto-refresh operations have already been performed. The carry-out signal 460, in turn, increments the row address counter 450 thereby moving the target row address to a new row for refresh. This same new row is then refreshed for all four (4) banks 410 during successive auto-refresh cycles.

When the volatile memory 110 is commanded into self-refresh mode, the volatile memory 110 begins to generate refreshes internally using the bank address currently stored in the entry bank address latch 210 from the point where the memory controller 120 left off issuing the last auto-refresh command to the volatile memory 110. This is rendered possible because, as previously mentioned, the memory controller 120 issues auto-refresh commands in a sequential manner.

Subsequently, following each refresh in self-refresh mode, the output of the entry bank address latch 210 is incremented. In effect, the entry bank address latch 210 becomes a counter. Hence, when in the self-refresh mode, the entry bank address latch 210 is incremented periodically and used to cycle through the banks 410; and the row increment counter 420 is also incremented periodically which, in turn, increments the row address counter 450 containing the target row address for a row to be refreshed, thereby allowing rows to be cycled through in the banks 410.

The volatile memory 110 as shown in FIG. 4 may further include the exit bank address latch 220 to effect the seamless refresh method described above. The bank address for the last bank that was refreshed in self-refresh mode is loaded into the exit bank address latch 220 by the volatile memory 110 and is available to the memory controller 120. Since the bank address of the last bank that was refreshed in self-refresh mode is now available to the memory controller 120, the memory controller 120 is able to pick up where the self-refresh mode left off and issue auto-refresh commands to refresh specific locations in the volatile memory 110. Hence, the volatile memory 110 is not required to reset the row increment counter 420 upon exiting the self-refresh mode, nor is the volatile memory 110 required to issue a number of auto-refreshes within one (1) average refresh period ($t_{REFI}$) after exiting the self-refresh mode.

In another embodiment, the exit row address latch 230 (see FIG. 6) may be used with the volatile memory 110 as shown in FIG. 4. The volatile memory 110 may further load a row address from the row address counter 450 into the exit row address latch 230. The row address represents the last row that was refreshed prior to the volatile memory 110 exiting the self-refresh mode. Contents of the exit bank address latch 220 and the exit row address latch 230 are available to the memory controller 120 (see FIG. 1). As a result, the memory controller 120 may utilize the information relating to the last refreshed bank and row for future operations accordingly.

In the second approach, a memory controller is able to issue refreshes in any order to a volatile memory for auto-refresh operations in auto-refresh mode and some banks in the volatile memory can be refreshed ahead more than others.

Figure 5:
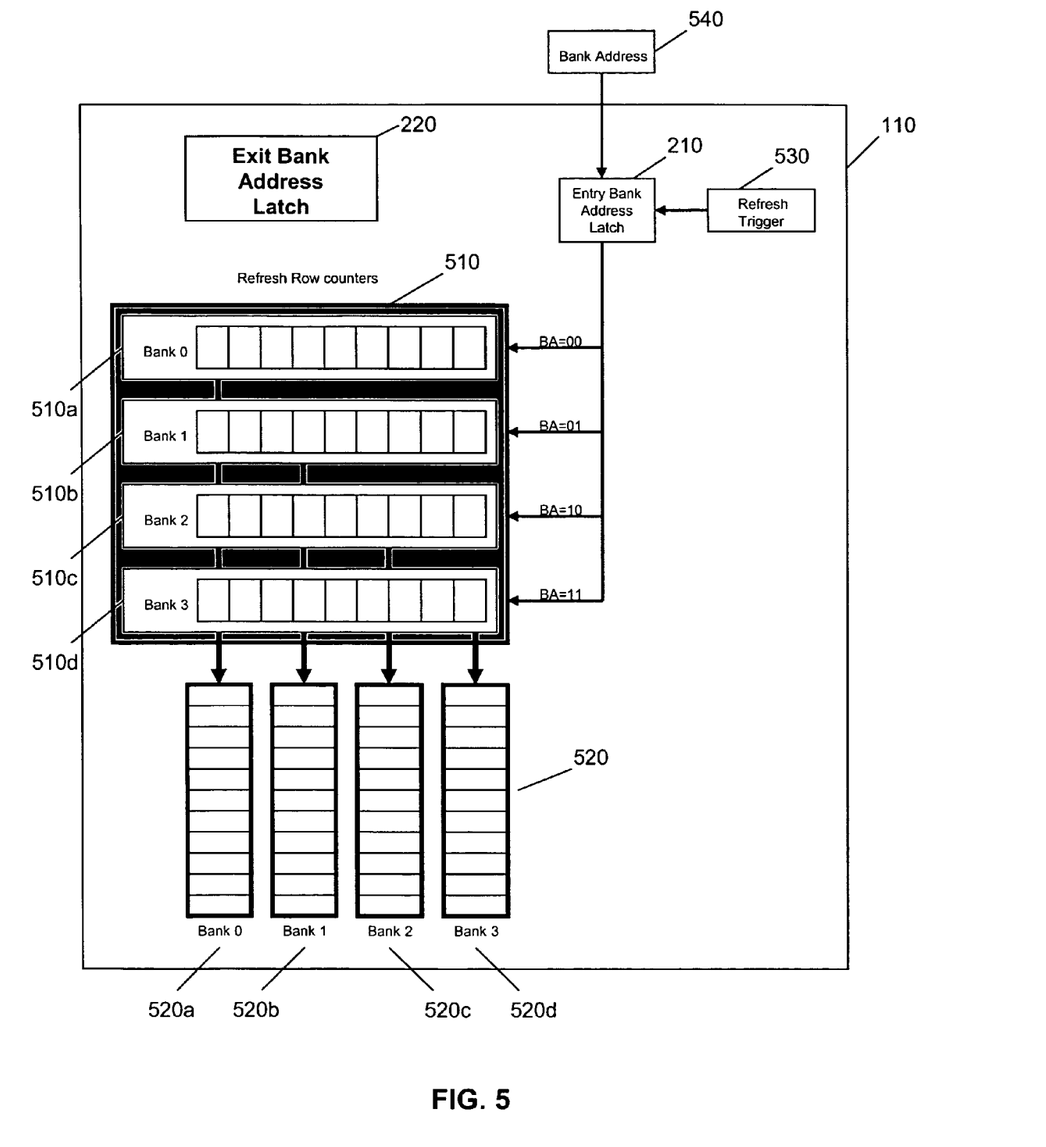
FIG. 5 is a simplified block diagram illustrating another embodiment of a volatile memory that can be used to practice the seamless refresh method according to the present disclosure.

FIG. 5 illustrates one embodiment of the volatile memory 110 that can be used to practice the independent refresh method under the second approach. The volatile memory 110 may further include the entry bank address latch 210, a refresh trigger 530, a number of refresh row counters 510*a–d* and a number of banks 520*a–d*. The entry bank address latch 210 is used to store the target bank address for the specific bank that is to be refreshed. The banks 520*a–d* are each associated with their corresponding refresh row counters 510*a–d*. The initial values for the refresh row counters 510*a–d* are initialized upon power-up or reset. For example, the refresh row counter 510*a* is associated with the bank 520*a*. The refresh row counters 510*a–d* are used to maintain target row addresses for rows that are to be refreshed in the respective banks 520*a–d*. The target row addresses stored in the refresh row counters 510*a–d* are independent of each other. The refresh trigger 530 is used to control the entry bank address latch 210 during self-refresh mode, as will be further described below. The refresh trigger 530 can be, for example, a clock or other timing mechanisms.

The memory controller 120 (see FIG. 1) can direct the volatile memory 110 to enter into auto-refresh mode and auto-refresh a specific bank, e.g., the bank 520*a*, within the volatile memory 110 while other banks (such as, banks 520*b–d*) remain available for access. To initiate an auto-refresh cycle, the memory controller 120 (see FIG. 1) issues an auto-refresh command to the volatile memory 110 and loads the bank address 540 into the entry bank address latch 210. The bank address 540 is used to identify one of the banks 520*a–d* that is targeted for refresh. The bank address 540 is also used to identify the corresponding refresh row counter associated with the bank to be refreshed. Hence, with the bank address stored in the entry bank address latch 210 and the target row address stored in the corresponding refresh row counter, a specific row in a specific bank can be identified for refresh. After the refresh operation is performed, the refresh row counter associated with the bank that has just been refreshed is incremented by control logic (not shown). Because the memory controller 120 is aware of the specific bank to be refreshed, access to the other banks can continue without interruption. This maximizes the memory data bus utilization, reduces power consumption by avoiding unnecessary row close/open sequences, and serves to minimize transfer latency.

In addition, because the banks 520a–d have their own refresh row counters 510a–d, the memory controller 120 has the flexibility to post independent refreshes to a specific bank. In other words, the banks 520a–d can be refreshed independent of each other. For example, in one instance, the memory controller 120 may issue auto-refresh command(s) to the volatile memory 110 to auto-refresh the bank 520a. One or more rows in the bank 520a are then refreshed beginning with the target row address stored in the refresh row counter 510a associated with the bank 520a. In another instance, the memory controller 120 may issue auto-refresh command(s) to the volatile memory 110 to auto-refresh a different bank, bank 520c. One or more rows in the bank 520c are then refreshed beginning with the target row address stored in the refresh row counter 510c associated with the bank 520c. It should be noted that the target row addresses stored in the refresh row counters 510a and 510c respectively can be the same or different.

By allowing each bank to be refreshed independently, the memory controller 120 is able to utilize those time periods when a given bank is idle to issue auto-refresh command(s) to the volatile memory 110 so that advanced refresh(es) can be performed on the idle bank ahead of schedule before they are due. Consequently, the availability of the banks 520a–d is increased since scheduled refresh(es) are performed less frequently when the banks 520a–d are active. In one example, if the bank 520a is idle for an extended period, additional advanced refresh(es) can be performed on the bank 520a; subsequently, scheduled refresh(es) for the bank 520a can be skipped while the bank 520a is active. In another example, if the bank 520b is idle for a shorter period, the memory controller 120 may choose to initiate fewer advanced refresh(es).

Having the ability to refresh ahead of schedule allows the banks 520a–d to operate more efficiently during periods of high data traffic. For example, if a given bank is n refreshes ahead of schedule, the memory controller 120 can avoid the overhead of issuing n regularly scheduled refreshes to that bank but can instead continue to carry out memory access operations. This maximizes memory data bus utilization, reduces power consumption by avoiding unnecessary row close/open sequences, and serves to minimize transfer latency.

Furthermore, the memory controller 120 may direct the volatile memory 110 to enter into self-refresh mode. When entering the self-refresh mode, the volatile memory 110 begins with the most recent bank address stored in the entry bank address latch 210. The most recent bank address is generally the bank address used in the latest auto-refresh operation. By using the bank address currently stored in the entry bank address latch 210, the volatile memory 110 is able to pick up where the memory controller 120 left off after the last auto-refresh operation.

During each self-refresh operation, a target bank to be refreshed is identified by the bank address currently stored in the entry bank address latch 210. A specific row in the target bank that is to be refreshed is further identified by the target row address currently stored in the refresh row counter associated with the target bank. Hence, a refresh operation can be performed on the specific row in the target bank.

Furthermore, during each self-refresh operation, the entry bank address latch 210 is incremented by the refresh trigger 530. By incrementing the entry bank address latch 210, the bank address is updated to identify the next target bank to be refreshed. In addition, the refresh row counter associated with the bank that has just been refreshed is also incremented by control logic (not shown) to provide an updated target row address for that bank; the updated target row address will be used next time that bank is to be refreshed.

The next self-refresh operation is then performed using the updated bank address in the entry bank address latch 210 and the corresponding refresh row counter associated with the bank identified by the updated bank address.

As a result, when the volatile memory 110 enters the self-refresh mode, the banks 520a–d are cycled through using their corresponding refresh row counters 510a–d.

Alternatively, when the volatile memory 110 enters self-refresh mode, all the banks 520a–d can be refreshed concurrently using the target row addresses stored respectively in the corresponding refresh row counters 510a–d. The concurrent refresh of all the banks 520a–d and related operations of the refresh row counters 510a–d can be achieved via control logic (not shown). Based on the disclosure and teaching provided herein, a person of ordinary skill in the art will appreciate how to effect the concurrent refresh in accordance with the concepts disclosed in the present disclosure.

The volatile memory 110 as shown in FIG. 5 may further include the exit bank address latch 220 to effect the seamless refresh method described above. Upon entry into the self-refresh mode, the bank address for the target bank where the self-refresh cycle should begin is loaded into the entry bank address latch 210. Upon exit out of the self-refresh mode, the bank address for the last bank that was refreshed in self-refresh mode is loaded into the exit bank address latch 220 by the volatile memory 110 and is available to the memory controller 120. By having the entry and exit bank address latches 210 and 220, the memory controller 120 is no longer required to direct the volatile memory 110 to perform additional refreshes prior to entering the self-refresh mode. Without using the seamless refresh method to synchronize the memory controller 120 and the volatile memory 110, additional advanced refreshes would have been needed for each bank prior to the volatile memory 110 entering into the self-refresh mode because for each of the banks 520 advanced refreshes could be needed when entering and exiting the self-refresh mode.

In another embodiment, the exit row address latch 230 (see FIG. 6) may be used with the volatile memory 110 as shown in FIG. 5. The volatile memory 110 may further load a row address from one of the refresh row counters 510 into the exit row address latch 230. The row address represents the last row that was refreshed prior to the volatile memory 110 exiting the self-refresh mode. Contents of the exit bank address latch 220 and the exit row address latch 230 are available to the memory controller 120 (see FIG. 1). As a result, the memory controller 120 may utilize the information relating to the last refreshed bank and row for future operations accordingly.

The methods or algorithms described in connection with the embodiments disclosed herein may be embodied directly in hardware, in a software module executable by a processor, or in a combination of both, in the form of control logic, programming instructions, or other directions. A software module may reside in RAM memory, flash memory, ROM memory, EPROM memory, EEPROM memory, registers, hard disk, a removable disk, a CD-ROM, or any other form of storage medium known in the art. A storage medium may be coupled to the processor such that the processor can read information from, and write information to, the storage medium. In the alternative, the storage medium may be integral to the processor.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit of scope of the invention. Thus, the present invention is not intended to be limited to the embodiments shown herein, but is to be accorded the full scope consistent with the claims, wherein reference to an element in the singular is not intended to mean "one and only one" unless specifically so stated, but rather "one or more". All structural and functional equivalents to the elements of the various embodiments described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for".

What is claimed is:

1. A memory system comprising:
a volatile memory having a plurality of banks and configured to engage in one of a plurality of operating modes including an auto-refresh mode and a self-refresh mode; and
a memory controller configured to direct the volatile memory to engage in one of the plurality of operating modes;
wherein upon the memory controller directing the volatile memory to engage in the self-refresh mode, the memory controller is further configured to provide an entry bank address to the volatile memory, the entry bank address corresponding to the first bank that is to be refreshed during the self-refresh mode; and
wherein upon the volatile memory exiting the self-refresh mode, the volatile memory is further configured to make an exit bank address available to the memory controller, the exit bank address corresponding to the last bank that was refreshed prior to the volatile memory exiting the self-refresh mode.

2. The system of claim 1 wherein the memory controller is further configured to issue an auto-refresh command to the volatile memory to refresh a bank that follows the last bank that was refreshed prior to the volatile memory exiting the self-refresh mode after the memory controller receives the exit bank address.

3. The system of claim 1 wherein upon the volatile memory exiting the self-refresh mode, the volatile memory is further configured to make an exit row address available to the memory controller, the exit row address corresponding to the last row that was refreshed prior to the volatile memory exiting the self-refresh mode.

4. The system of claim 1 wherein the volatile memory is one of a dynamic random access memory (DRAM) or a synchronous DRAM.

5. A memory system comprising:
a volatile memory having an entry bank address latch, an exit bank address latch and a plurality of banks; and
a memory controller configured to direct the volatile memory to engage in one of a plurality of operating modes including an auto-refresh mode and a self-refresh mode;
wherein upon the memory controller directing the volatile memory to engage in the self-refresh mode, the memory controller is further configured to load an entry bank address into the entry bank address latch, the entry bank address corresponding to the first bank that is to be refreshed during the self-refresh mode; and
wherein upon the volatile memory exiting the self-refresh mode, the volatile memory is further configured to load an exit bank address into the exit bank address latch, the exit bank address corresponding to the last bank that was refreshed prior to the volatile memory exiting the self-refresh mode, and wherein the exit bank address latch is accessible to the memory controller.

6. The system of claim 5 wherein the memory controller is further configured to issue an auto-refresh command to the volatile memory to refresh a bank that follows the last bank that was refreshed prior to the volatile memory exiting the self-refresh mode after the memory controller retrieves the exit bank address from the exit bank address latch.

7. The system of claim 5 wherein the volatile memory further includes an exit row address latch, the exit row address latch being accessible to the memory controller; and
wherein upon the volatile memory exiting the self-refresh mode, the volatile memory is further configured to load an exit row address into the exit row address latch, the exit row address corresponding to the last row that was refreshed prior to the volatile memory exiting the self-refresh mode.

8. The system of claim 5 wherein the volatile memory is one of a dynamic random access memory (DRAM) or a synchronous DRAM.

9. A memory system comprising:
a volatile memory having a plurality of banks, first storage means for storing an entry bank address and second storage means for storing an exit bank address; and
a memory controller configured to direct the volatile memory to engage in one of a plurality of operating modes including an auto-refresh mode and a self-refresh mode;
wherein upon the memory controller directing the volatile memory to engage in the self-refresh mode, the memory controller is further configured to load the entry bank address into the first storage means, the entry bank address corresponding to the first bank that is to be refreshed during the self-refresh mode; and
wherein upon the volatile memory exiting the self-refresh mode, the volatile memory is further configured to load the exit bank address into the second storage means, the exit bank address corresponding to the last bank that was refreshed prior to the volatile memory exiting the self-refresh mode, and wherein the second storage means is accessible to the memory controller.

10. The system of claim 9 wherein the memory controller is further configured to issue an auto-refresh command to the volatile memory to refresh a bank that follows the last bank that was refreshed prior to the volatile memory exiting the self-refresh mode after the memory controller retrieves the exit bank address from the second storage means.

11. The system of claim 9 wherein the volatile memory further includes a third storage means for storing an exit row address; and wherein upon the volatile memory exiting the self-refresh mode, the volatile memory is further configured to load the exit row address into the third storage means, the exit row address corresponding to the last row that was refreshed prior to the volatile memory exiting the self-refresh mode, the third storage means being accessible to the memory controller.

12. The system of claim 10 wherein the volatile memory is one of a dynamic random access memory (DRAM) or a synchronous DRAM.

13. A memory system comprising:

a volatile memory having a plurality of banks, an entry bank address latch, an exit bank address latch, a refresh clock and a refresh counter, the refresh counter further having a row address counter and a row increment counter, wherein the refresh clock is configured to control the refresh counter and the entry bank address latch, wherein the row increment counter is configured to increment the row address counter; and a memory controller configured to control the volatile memory to engage in an auto-refresh mode or a self-refresh mode, the memory controller further configured to load a bank address for a target bank into the entry bank address latch;

wherein the memory controller is further configured to direct the volatile memory to engage in the auto-refresh mode to perform an auto-refresh operation on the target bank;

wherein the row increment counter is configured to be incremented each time an auto-refresh operation is performed;

wherein the row increment counter is further configured to increment the row address counter after a predetermined number of auto-refresh operations have been performed;

wherein the row address counter includes a row address that is usable to identify a row in the target bank for the auto-refresh operation;

wherein upon the volatile memory entering into the self-refresh mode, the volatile memory is further configured to perform one or more self-refresh operations using the bank address stored in the entry bank address latch and contents stored in the refresh counter;

wherein the volatile memory is further configured to increment the entry bank address latch and the refresh counter where appropriate after each self-refresh operation; and wherein upon the volatile memory exiting the self-refresh mode, the volatile memory is configured to load the current value of the entry bank address latch into the exit bank address latch, the value in the exit bank address latch corresponding to the last bank that was refreshed prior to the volatile memory exiting the self-refresh mode.

14. The system of claim 13 wherein the exit bank address latch is accessible to the memory controller; and wherein the memory controller is further configured to issue an auto-refresh command to the volatile memory to refresh a bank that follows the last bank that was refreshed prior to the volatile memory exiting the self-refresh mode after the memory controller retrieves the value stored in the exit bank address latch.

15. The system of claim 13 wherein upon the volatile memory exiting the self-refresh mode, the volatile memory is further configured to not reset the row increment counter.

16. The system of claim 13 wherein upon the volatile memory exiting the self-refresh mode, the memory controller is further configured to not issue any additional refresh within an average refresh period.

17. The system of claim 13 wherein the volatile memory further includes an exit row address latch; and wherein upon the volatile memory exiting the self-refresh mode, the volatile memory is configured to load the current value of the row address counter into the exit row address latch, the value in the exit row address latch corresponding to the last row that was refreshed prior to the volatile memory exiting the self-refresh mode.

18. The system of claim 13 wherein the volatile memory is one of a dynamic random access memory (DRAM) or a synchronous DRAM.

19. A memory system comprising:

a volatile memory having an entry bank address latch, an exit bank address latch, a plurality of banks, a plurality of refresh row counters, each refresh row counter associated with a corresponding bank and configured to store a target row address; and a memory controller configured to direct the volatile memory to engage in an auto-refresh mode, the memory controller further configured to load a target bank address into the entry bank address latch;

wherein the volatile memory is configured to perform an auto-refresh operation in the auto-refresh mode, the auto-refresh operation being performed on a target bank identified by the target bank address using the target row address stored in the refresh row counter associated with the target bank;

wherein the memory controller is further configured to direct the volatile memory to engage in a self-refresh mode;

wherein the volatile memory is further configured to cycle through the plurality of banks in the self-refresh mode by incrementing the entry bank address latch to generate the current target bank address; and wherein during each self-refresh operation, the volatile memory is further configured to refresh the bank identified by the current target bank address based on the target row address stored in the associated refresh row counter; and wherein upon the volatile memory exiting the self-refresh mode, the volatile memory is further configured to load the value stored in the entry bank address latch into the exit bank address latch, the value in the exit bank address latch corresponding to the last bank that was refreshed prior to the volatile memory exiting the self-refresh mode.

20. The system of claim 19 wherein the exit bank address latch is accessible to the memory controller; and wherein the memory controller is further configured to issue an auto-refresh command to the volatile memory to refresh a bank that follows the last bank that was refreshed prior to the volatile memory exiting the self-refresh mode after the memory controller retrieves the value stored in the exit bank address latch.

21. The system of claim 19 wherein the volatile memory is further configured to not perform any advanced refreshes prior to the volatile memory entering into the self-refresh mode.

22. The system of claim 19 wherein the volatile memory further includes an exit row address latch, the exit row address latch being accessible to the memory controller; and
   wherein upon the volatile memory exiting the self-refresh mode, the volatile memory is further configured to load the value stored in the refresh row counter associated with the last bank that was refreshed prior to the volatile memory exiting the self-refresh mode into the exit row address latch.

23. The system of claim 19 wherein the volatile memory is one of a dynamic random access memory (DRAM) or a synchronous DRAM.

24. A method for controlling memory refresh for a volatile memory having a plurality of banks, comprising:
   forwarding an entry bank address to the volatile memory;
   directing the volatile memory to engage in a self-refresh mode to perform one or more self-refresh operations based on the entry bank address, the entry bank address corresponding to a target bank where the one or more self-refresh operations is to begin; and
   directing the volatile memory to make available an exit bank address upon the volatile memory exiting the self-refresh mode, the exit bank address corresponding to the last bank that was refreshed prior to the volatile memory exiting the self-refresh mode.

25. The method of claim 24 further comprising:
   directing the volatile memory to engage in an auto-refresh mode to perform an auto-refresh operation on a bank that follows the bank identified by the exit bank address.

26. The method of claim 24 further comprising:
   directing the volatile memory to make available an exit row address upon the volatile memory exiting the self-refresh mode, the exit row address corresponding to the last row that was refreshed prior to the volatile memory exiting the self-refresh mode.

27. A method for controlling memory refresh for a volatile memory having an entry bank address latch, an exit bank address latch and a plurality of banks, comprising:
   loading an entry bank address into the entry bank address latch;
   directing the volatile memory to retrieve the entry bank address from the entry bank address latch;
   directing the volatile memory to engage in a self-refresh mode to perform one or more self-refresh operations based on the entry bank address, the entry bank address corresponding to a target bank where the one or more self-refresh operations is to begin; and
   storing an exit bank address into the exit bank address latch upon the volatile memory exiting the self-refresh mode, the exit bank address corresponding to the last bank that was refreshed prior to the volatile memory exiting the self-refresh mode.

28. The method of claim 27 further comprising:
   retrieving the exit bank address from the exit bank address latch; and
   directing the volatile memory to engage in an auto-refresh mode to perform an auto-refresh operation on a bank that follows the bank identified by the exit bank address.

29. The method of claim 27 wherein the volatile memory further includes an exit row address latch, the method further comprising:
   storing an exit row address into the exit row address latch upon the volatile memory exiting the self-refresh mode, the exit row address corresponding to the last row that was refreshed prior to the volatile memory exiting the self-refresh mode.

* * * * *